United States Patent [19]
Porth

[11] 3,970,040
[45] July 20, 1976

[54] COATING TRAY

[75] Inventor: Frank L. Porth, Morley, Mich.

[73] Assignee: James A. Black, Kent City, Mich.

[22] Filed: Apr. 23, 1975

[21] Appl. No.: 570,735

Related U.S. Application Data

[63] Continuation of Ser. No. 341,486, March 15, 1973, abandoned.

[52] U.S. Cl. ............................... 118/406; 118/415
[51] Int. Cl.² ........................................ B05C 11/04
[58] Field of Search ........... 118/411, 413, 415, 406, 118/323, 123, 126; 101/123, 124, 114, 115; 222/509

[56] References Cited
UNITED STATES PATENTS

| | | | |
|---|---|---|---|
| 2,251,264 | 8/1941 | Berch et al. | 118/401 UX |
| 2,942,293 | 6/1960 | Wahl | 118/401 UX |
| 3,239,871 | 3/1966 | LeMieux et al. | 401/263 X |

FOREIGN PATENTS OR APPLICATIONS

| | | | |
|---|---|---|---|
| 142,034 | 1/1903 | Germany | 118/415 |

*Primary Examiner*—Morris Kaplan
*Attorney, Agent, or Firm*—Price, Heneveld, Huizenga & Cooper

[57] ABSTRACT

A tray suitable for providing a uniform coating of predetermined thickness on sheet material includes a generally V-shaped trough for dispensing a fluid contained therein through a plurality of apertures formed through the bottom of the trough and spaced along its length. Along the outer surface of the apex of the V-shaped trough, there is formed a channel communicating with the apertures and defining a pair of spaced continuous blades extending along the length of the trough and spanning the apertures. The lands of material between the apertures of the trough are tapered to a point on the side of the trough adjacent the channel to provide a uniform supply of coating material within the channel. As the trough is moved across the surface of a sheet to be coated, the trailing blade which is spaced at a desired height from the sheet material, provides a uniform coating of fluid to the sheet.

7 Claims, 16 Drawing Figures

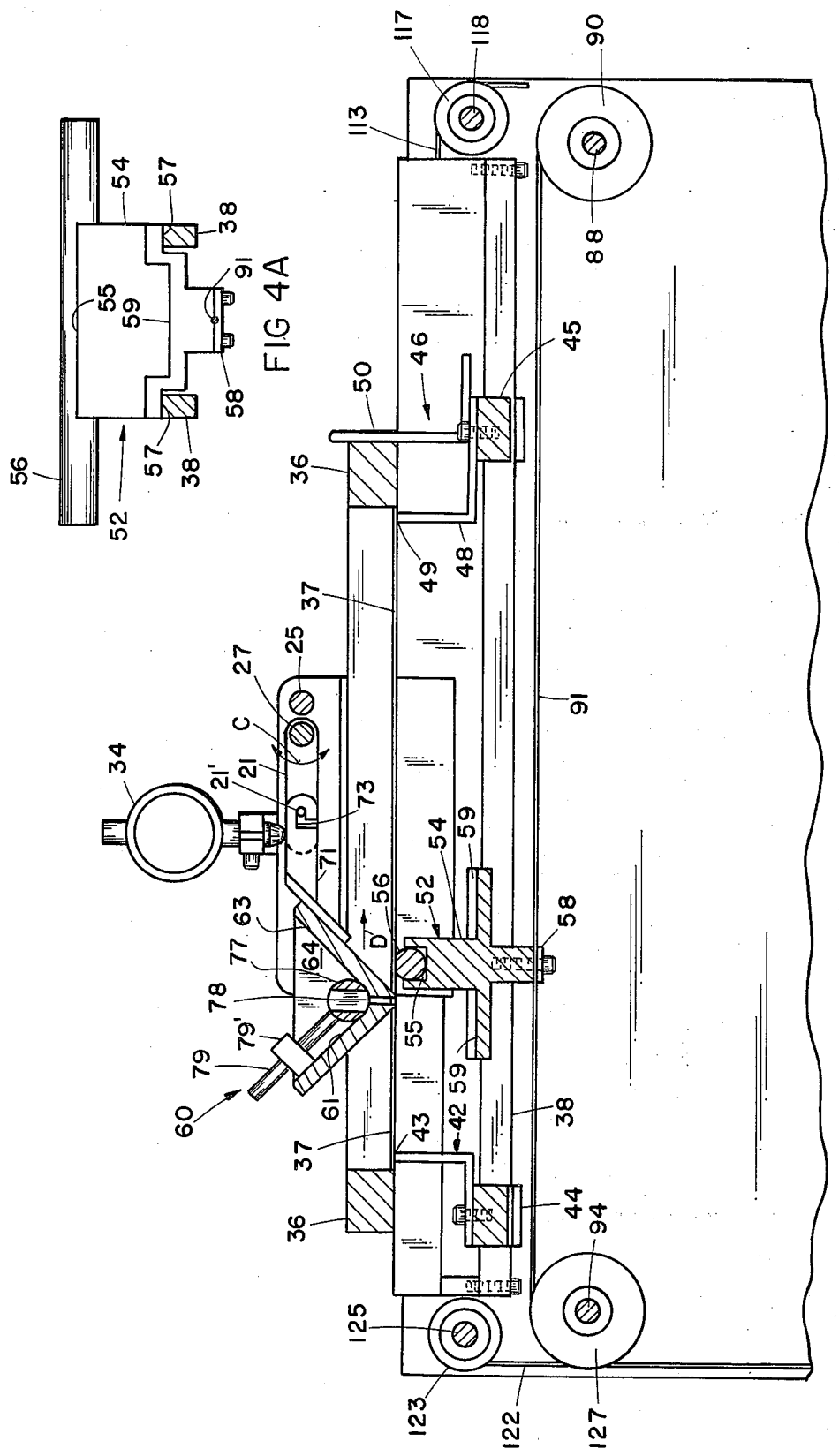

COATING TRAY

This is a continuation of application Ser. No. 341,486, filed Mar. 15, 1973 and now abandoned.

BACKGROUND OF THE INVENTION

The present invention relates to an improved coating tray for providing a uniform coat of fluid material on sheet stock such as a stencil screen.

Many existing screen coating apparatus employ reservoirs holding a screen coating fluid such as a photoresist and provide an adjustable flow rate through apertures therein to supply the desired thickness of coating as the coating reservoir is moved across the screen at a uniform speed. Copending patent application entitled PRINTING SCREEN COATING APPARATUS AND METHOD, Ser. No. 258,856, filed June 1, 1972, now U.S. Pat. No. 3,834,348, and assigned to the present assignee describes coating apparatus in which a coating fluid is controllably discharged by a tray reservoir and evenly spread by means of a rake-like follower blade having a plurality of teeth contacting the screen and distributing the fluid as it is applied to the screen.

Although such coating apparatus performs adequately for most applications, the flow rate control mechanism is relatively complex and requires periodic cleaning and maintenance to assure the flow rate will be constant for the desired setting to assure a uniform coating of desired thickness.

SUMMARY OF THE INVENTION

The coating tray of the present invention represents an improved structure which relies upon the relative positioning of the coating tray with respect to the screen to provide the desired thickness of coating and utilizes a uniform flow rate thereby eliminating the necessity of means for adjustably controlling the flow rate of the fluid from the reservoir. By so doing, the mechanism employed is greatly simplified and requires substantially less periodic maintenance.

Coating trays embodying the present invention comprise a generally V-shaped trough defining a fluid reservoir with a plurality of apertures formed through the apex of the V at spaced intervals along the tray. On the outer side of the apex there is formed a channel extending along the length of the trough and communicating with the apertures. The channel is defined by a pair of spaced blades extending along the length of the tray and spanning the apertures. The tray is positioned and moved across a stencil screen with the edge of the trailing blade spaced at a predetermined distance from the screen corresponding to the desired thickness of the coating. As the tray is moved across the screen at a uniform speed, a fluid coating of uniform and selectable thickness is achieved.

It is an object, therefore, of the present invention to provide an improved coating tray for effecting a uniform coating of fluid to a planar sheet of material.

Another object of the present invention is to provide an improved method of coating screen material with a photo-resist.

A further object of the present invention is to provide a unique coating tray providing a fluid filled channel positioned adjacent a screen to be coated, and having a blade defining an edge of the channel positionable in spaced relationship to the screen for controlling the desired thickness of the coating applied.

These and other objects of the present invention will become apparent upon reading the specification together with the accompanying drawings in which:

BRIEF DESCRIPTION OF THE DRAWINGS

FIG. 4 is a fragmentary cross-sectional view of the machine taken along the section lines IV—IV of FIG. 1;

FIG. 4A is a fragmentary front elevation partly in cross section of the support carriage means seen in FIG. 4;

DETAILED DESCRIPTION OF THE PREFERRED EMBODIMENT

Figure 1:
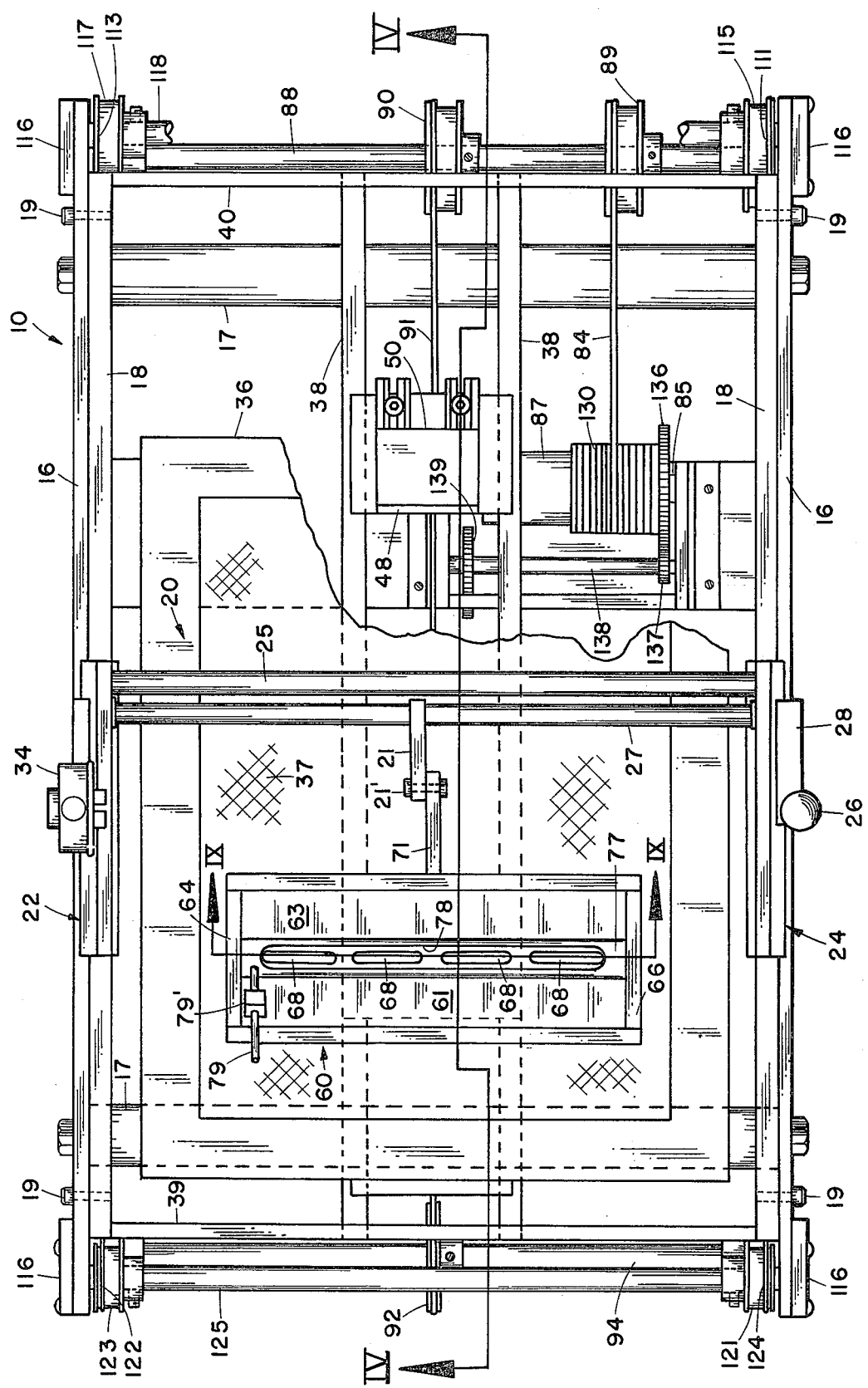
FIG. 1 is a top plan view partly broken away of the screen coating machine with a coating tray and showing a partly broken away stencil screen and frame positioned on the machine.
Figure 2:
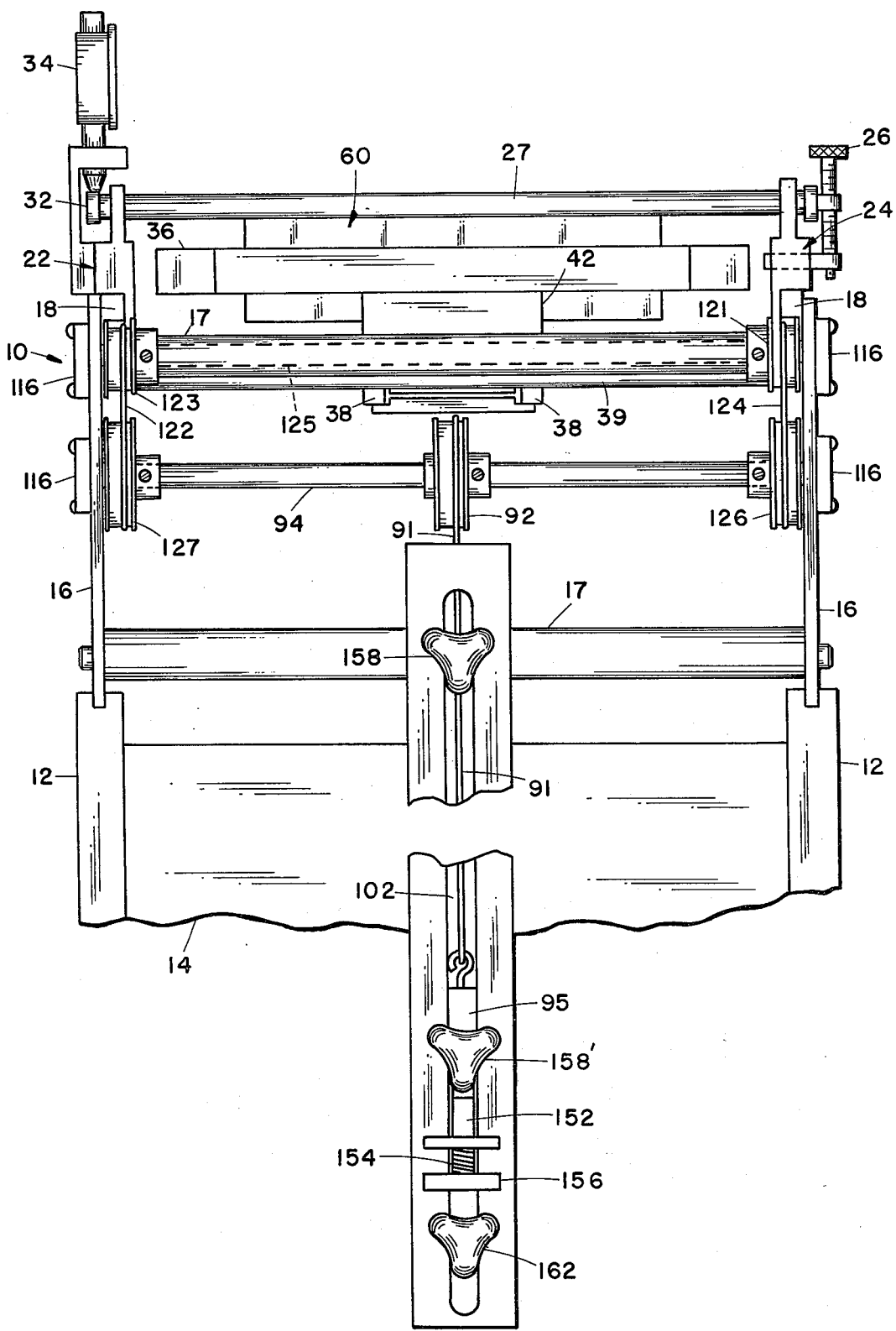
FIG. 2 is a fragmentary left side elevation of the machine shown in FIG. 1.
Figure 3:
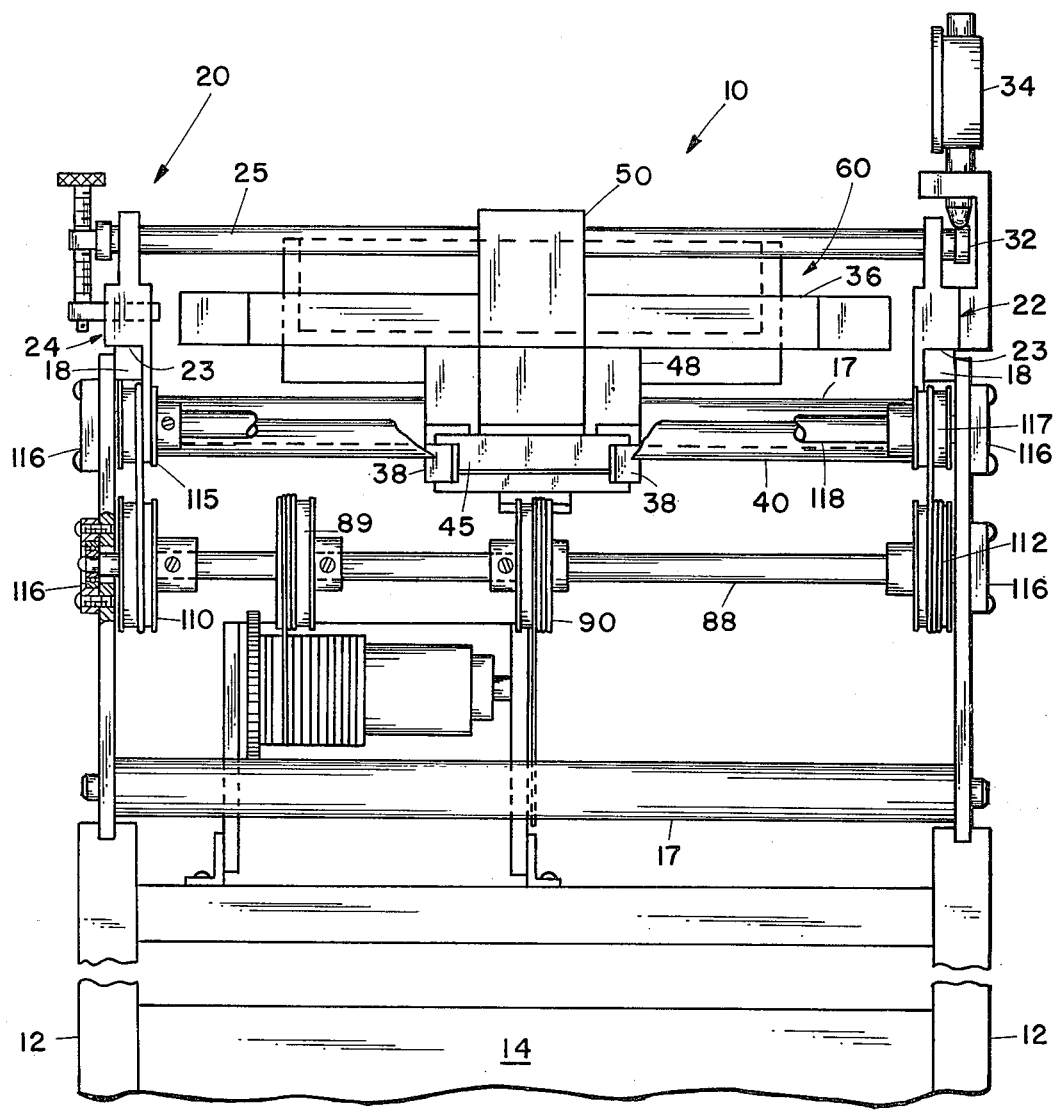
FIG. 3 is a fragmentary right side elevation partly in cross section of the machine shown in FIG. 1.

Referring now to FIGS. 1–4, there is shown the coating machine 10 which is mounted on a rectangular support having a pair of vertical side walls 12 and end walls 14 (FIGS. 2 and 3). The base of machine 10 extends upwardly from the side walls of the support and includes side plates 16 fitted in notches along the top of walls 12. Plates 16 are supported in horizontally spaced relationship by means of a plurality of cross braces 17 extending between the plates. A coating tray carriage assembly 20 is slidably supported on the base by a pair of longitudinally extending brass guide rails 18 bolted along the inner top edge of each of the plates 16 by means of bolts 19 as best seen in FIGS. 1–3.

The coating tray carriage assembly 20 comprises first and second end brackets 22 and 24, respectively, slidably supported in spaced relationship on guide rails 18 by a rigid cross brace 25 such that an L-shaped notch 23 formed in each bracket fits over the rails 18 as best seen in FIGS. 2 and 3. Carriage 20 includes means for coupling a coating tray assembly 60 thereto which, as seen in FIG. 4, includes arm 21 rigidly coupled to a pivot axle 27 at one end and having a pin 21' at the opposite end thereof for engaging the tray assembly as described below.

Figure 8:
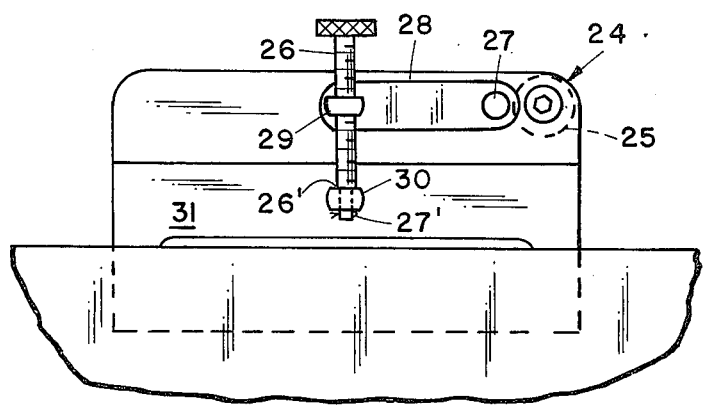
FIG. 8 is an enlarged fragmentary view of the means for adjusting the coating tray.

Axle 27 is included in means for adjusting the position of the coating tray to control the thickness of the coating applied to a stencil screen and is rotatably mounted between brackets 22 and 24 in a conventional manner. A linkage 28 (FIG. 8) is rigidly coupled at one end to axle 27 with the opposite end coupled to an adjustment screw 26 by means of a threaded sleeve 29 attached to linkage 28. The end of adjustment screw 26 is coupled to a sleeve 30 attached to the outer surface 31 of bracket 24. Screw 26 has a shoulder 26' which contacts the top of sleeve 30. A C-clip 27' is fitted to the portion of screw 20 extending through the sleeve such that screw 26 can rotate but not move vertically.

Bracket 22 includes a similar linkage 32 which permits the pivot axle 27 to rotate while moving linkage 32 to engage a dial indicator 34 which, as will be described in greater detail below, can be employed to provide a reading directly related to the thickness of the coating applied by the machine.

Continuing now with the overall description of the machine, the base further includes means for supporting a stencil screen frame 36 having a stencil screen 37 conventionally attached thereto such that the screen is held tautly between the sides of frame 36. The means for supporting the frame comprises a pair of parallel spaced and longitudinally extending support rods 38 which, as seen in FIGS. 1, 2 and 3, are supported on opposite ends of the base by means of transverse support members 39 and 40. The support rods 38 are positioned near the upper portion of the base of the machine and support a first screen holding bracket 42 at one end thereof. Bracket 42, as best seen in FIG. 4, is generally L-shaped and has an upper edge 43 at a horizontal level supporting directly thereon screen 37 as seen in FIG. 4. Mounting block 44 couples bracket 42 to the support rod 38.

At the opposite end of the screen frame, and also mounted to rods 38, is a second bracket 46 which includes a first L-shaped section 48 having an upper edge 49 supporting the screen 37, as seen in FIG. 4, and a second adjustable L-shaped section 50 which is horizontally spaced from section 48 and which extends upwardly above the screen frame 36 to form a stop for the screen frame as best seen in FIGS. 1, 3 and 4. Bracket 46 is coupled to rods 38 by means of a mounting block 45 as seen in FIGS. 3 and 4. Brackets 42 and 46 are shaped such that the screen frame and screen (36, 37) can be positioned as seen in the figures or positioned in an inverted fashion such that a coating can be applied to either side of the screen. The screen need not be clamped to the base of the machine and rests upon the top edges of the support means as seen in the figures. The screen is, however, generally centered on the support means, as shown in FIG. 1, such that the coating tray assembly 60 will be centered over the area of the screen to be coated.

The support rods 38, which serve in part as means for supporting the screen and screen frame thereon, additionally provide guided support for a second carriage assembly 52 which, as seen in FIGS. 4 and 4A, comprises a vertically extending body 54 having a U-shaped cradle 55 formed in the top thereof for receiving and holding a cylindrical support rod 56. The base of body 54 extends along rods 38 and includes L-shaped notches 57 (FIG. 4A) to provide sliding guidable support for member 52 along the parallel spaced rods 38. The height of body 54 is selected such that the control rod 56 contacts the undersurface of screen 37, as seen in FIG. 4, to provide support for the screen immediately adjacent the tray assembly 60.

A block 58 is coupled to a downwardly extending portion of member 54 to provide means for coupling the carriage so formed to a cable 91 for driving the carriage as described below. The base of carriage 52 is recessed at opposite sides 59, as best seen in FIGS. 4 and 4A, such that the carriage can slide under the L-shaped brackets 42 and 46, respectively, and span the full length of the screen 37 during the operation of the machine. Before describing the gravity drive menas for the coating tray carriage 20 and the support carriage assembly 52, a description of the coating tray assembly 60 follows.

Figure 9:
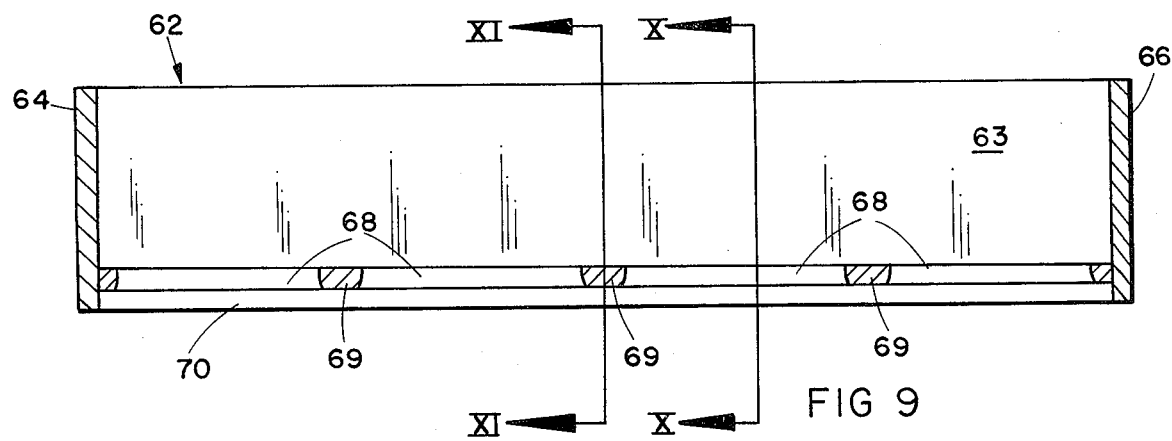
FIG. 9 is a cross-sectional view of the coating tray taken along the section lines IX—IX of FIG. 1.
Figures 10, 11:
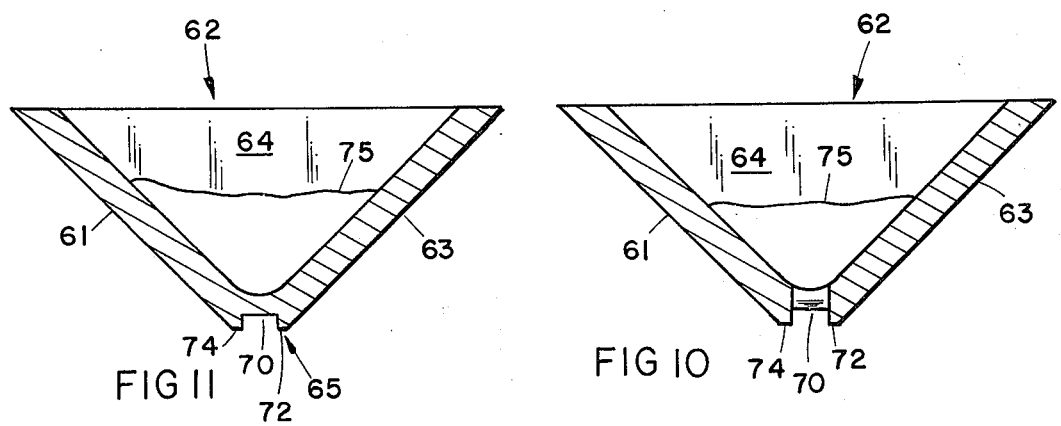
FIG. 10 is a cross-sectional view of the coating tray taken along the section lines X—X of FIG. 9.
FIG. 11 is a cross-sectional view of the coating tray taken along the section lines XI—XI of FIG. 9.

Assembly 60 comprises, as best seen in FIGS. 1, 4, 9–11 and 14 and 15; a generally V-shaped trough 62 having side walls 61 and 63 extending generally upwardly and outwardly from the apex 65 of the trough. End caps 64 and 66 close off the opposite ends of the trough. The interior portion of the trough 62 defines a reservoir for receiving a coating fluid 75 (FIGS. 10 and 11), such as a photo-resist, to be applied to the printing screen or other sheet stock employed with the present machine. Along the bottom of the trough there is formed a plurality of spaced apertures 68 between which are support lands 69. Lands 69 are tapered downwardly to a point along the outer edge of the trough, as best seen in FIG. 9, such that the coating fluid will uniformly fill a channel 70 formed along the apex of the V-shaped trough along its outer surface as best seen in FIGS. 10 and 11.

Figure 12:
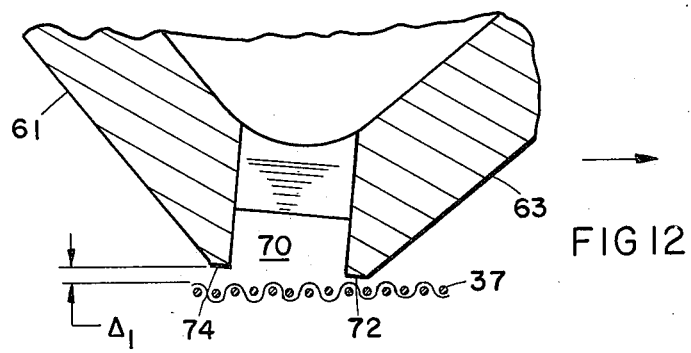
FIG. 12 is a greatly enlarged fragmentary cross-sectional view of the apex of the coating tray shown in a first position relative to the stencil screen.
Figure 13:
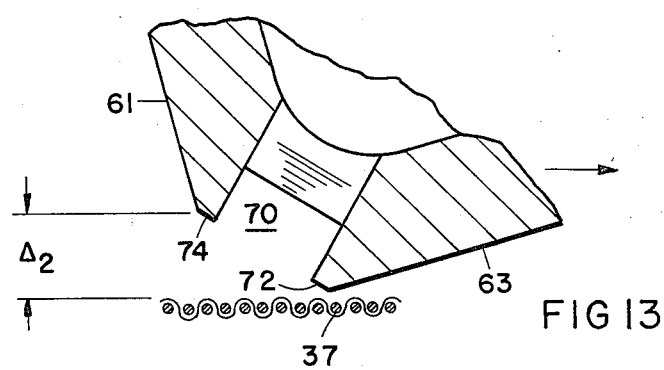
FIG. 13 is a greatly enlarged fragmentary cross-sectional view of the apex of the coating tray shown in a second position with respect to the stencil screen frame.

Channel 70 is defined by a forward blade 72 and a trailing blade 74 which are parallel extending blades spanning the apertures 68 and extending the length of the trough 62. The channel 70 so defined is uniformly filled with fluid 75 by virtue of the downwardly convergent tapered lands 69 (FIG. 9) such that the channel which is positioned immediately adjacent the screen 37, as seen in FIGS. 12 and 13, uniformly applies fluid 75 to the surface of the screen 37 as described in greater detail below under the heading OPERATION.

Coupled to the outer surface of wall 63 of the coating tray is coupling arm 71 (FIGS. 1 and 4) which includes an L-shaped slot 73 adapted to receive pin 21' of coupling arm 21 of carriage 20. This interconnection between the carriage and coating tray permits the tray to be tilted by the adjustment of screw 26, as described below, to vary the thickness of the applied coating.

Figure 15:
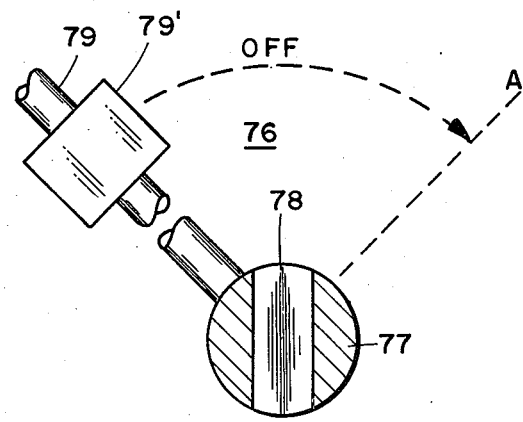
FIG. 15 is a fragmentary cross-sectional view of the cut-off valve shown in FIG. 14 taken along the section lines XV—XV.
Figure 14:
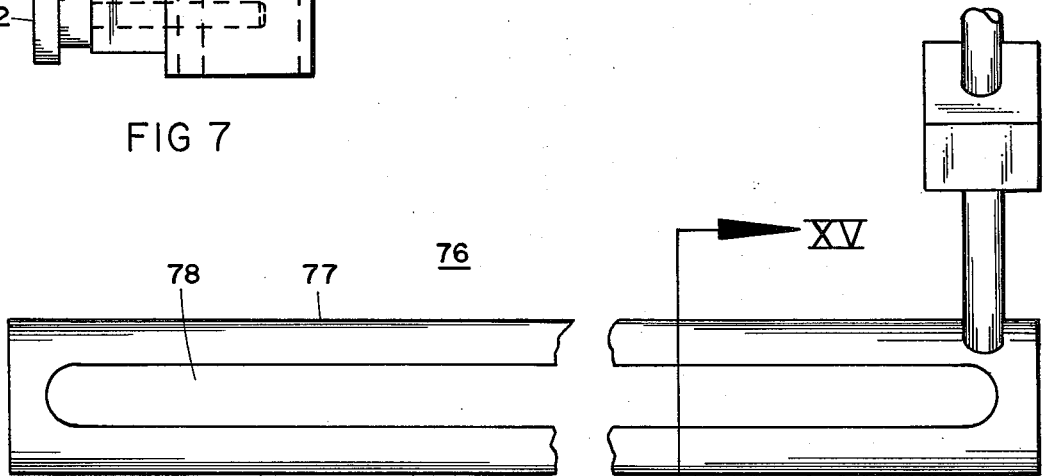
FIG. 14 is an enlarged fragmentary plan view of the cut-off valve for the coating tray also shown in FIG. 1.

Coating tray assembly 60 includes a cut-off valve 76 which, as best seen in FIGS. 14 and 15, comprises a rod 77 having an elongated slot 78 formed therein to provide a path for fluid when the control valve is in the open position as seen in FIG. 1. A control handle 79 is provided with a stop 79' adapted to rest along the inner surface of one of the side walls of the trough 62 such that the valve, when moved into a position indicated by axis A in FIG. 15, will be in a closed position such that the solid portion of rod 77 blocks apertures 68 of the trough thereby cutting off the flow of fluid from the trough.

Figure 5:
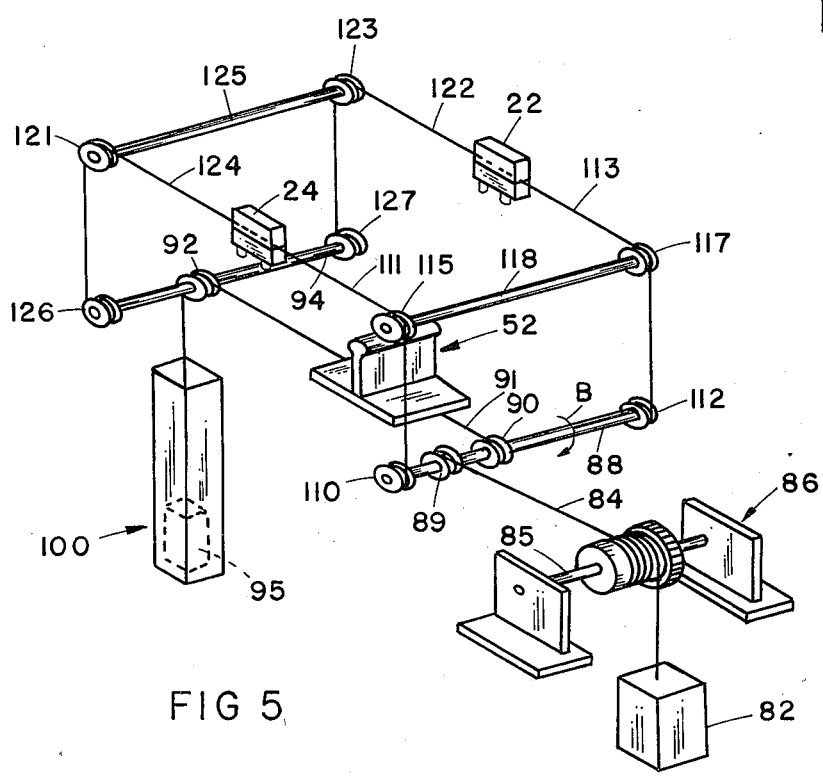
FIG. 5 is a schematic diagram of the gravity drive mechanism employed in the machine and shows the stringing of the various cables employed therewith.

The drive mechanism 80 for the machine is best illustrated in FIG. 5 and comprises a gravity drive system with a drive weight 82 coupled to a cable 84 extending around the axle 85 of a speed regulator assembly 86. Cable 84 extends to a drive shaft 88 by means of an attachment at one end to a drive pulley 89 on shaft 88. A drive pulley 90 has a cable 91 attached at one end thereto and is coupled to the support carriage assembly 52 by means of block 58 (FIGS. 4 and 4A). Cable 91 extends to a drive pulley 92 positioned on drive shaft 94. The end of cable 91 remote from pulley 90 attaches to a counterweight 95 which is fitted within a weight release assembly 100 shown in detail in FIGS. 2 and 7 and described in greater detail below.

A pair of drive pulleys 110 and 112 are positioned at opposite ends of drive shaft 88 and have a first cable 111 and a second cable 113 having one end of each coupled thereto respectively. Cables 111 and 113 extend over pulleys 115 and 117, respectively, positioned on idler shaft 118 and further extend and are attached to the brackets 24 and 22, respectively, of the coating tray carriage 20 by means of suitable attaching bolts.

The opposite ends of brackets 24 and 22 have ends of cables 124 and 122 simultaneously coupled thereto, which cables extend over idler pulleys 121 and 123 mounted on an idler shaft 125. The opposite ends of cables 124 and 122 are then attached to pulleys 126 and 127, respectively, mounted on opposite ends of drive shaft 94. It is noted here that each of the axles are rotatably mounted between the side plates 16 by means of suitable bearing assemblies 116 as seen in FIG. 3.

Thus, it is seen in FIG. 5 that when counterweight 95 is in its lowermost position, drive weight 82 is elevated and as the release mechanism 100 is actuated to release weight 82, drive axle 88 is rotated in a direction, indicated by arrow B in FIG. 5, to draw carriage assemblies 20 and 52 to the right as seen in FIGS. 1 and 5. The uniform speed at which the carriages are moved is governed by the adjustable speed control mechanism 86 now described.

Figure 6:
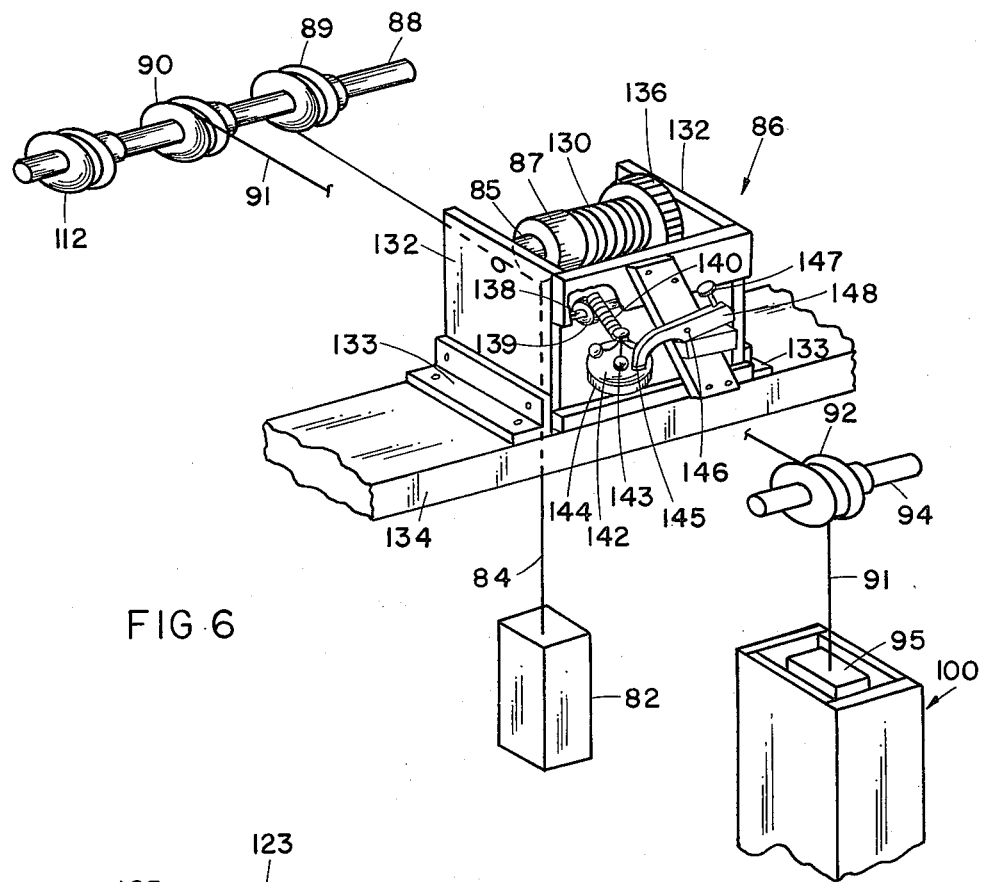
FIG. 6 is a fragmentary perspective view of the speed regulator mechanism shown schematically in FIG. 5 and also seen in FIGS. 1 and 3.

The speed regulator 86 is best seen in FIGS. 1 and 6. The drive cable 84 is strung around a grooved drum 130 coupled to axle 85 by means of one way clutch 87. Clutch 87 engages the speed regulator to regulate the speed of rotation of drive shaft 88 only when the shaft is rotating in a direction to move carriages through a coating stroke. During the return motion, the speed regulator is disengaged by the clutch to facilitate the raising of weight 82.

Axle 85 is supported between a pair of end walls 132 mounted to a platform 134 by means of brackets 133. Platform 134 extends between and is mounted to side walls 12 as seen in FIG. 3. Attached to axle 85 at one end is a gear 136 which engages a second gear 137 (FIG. 1) mounted on a speed regulating shaft 138 also supported between walls 132. On the opposite end of shaft 138 there is provided a follower gear 139 which engages a worm gear 140 associated with a speed governor 142.

Governor 142 is a conventional centrifugal type of speed governor with a plurality of weights 143 mounted on arms coupled to the worm gear shaft such that as the worm gear is rotated by the rotation of shaft 138, in turn rotated by shaft 85 as weight 82 is lowered, a disc 144 movably coupled to the arms associated with the weights is moved by the outward motion of the rotating weights 143 until disc 144 contacts a pressure pad 145 associated with an adjustable brake mechanism 146. Brake mechanism 146 includes an adjustment knob 147 such that the arm 148 on which pad 145 is mounted can be moved toward and away from the moving disc 144 so that the braking action or the speed at which the regulator is effective can be increased or decreased.

Thus, it is seen that the speed regulator 86 operates to first regulate the rotational speed of shaft 138 which in turn, through its coupling to shaft 85 on which drum 130 mounted, regulates the speed at which drive weight 82 is lowered and the speed at which the drive shaft 88 is rotated. This in turn regulates the speed at which carriages 52 and 20 are moved thereby varying the speed at which the coating tray is pulled across the stencil screen 37.

Figure 7:
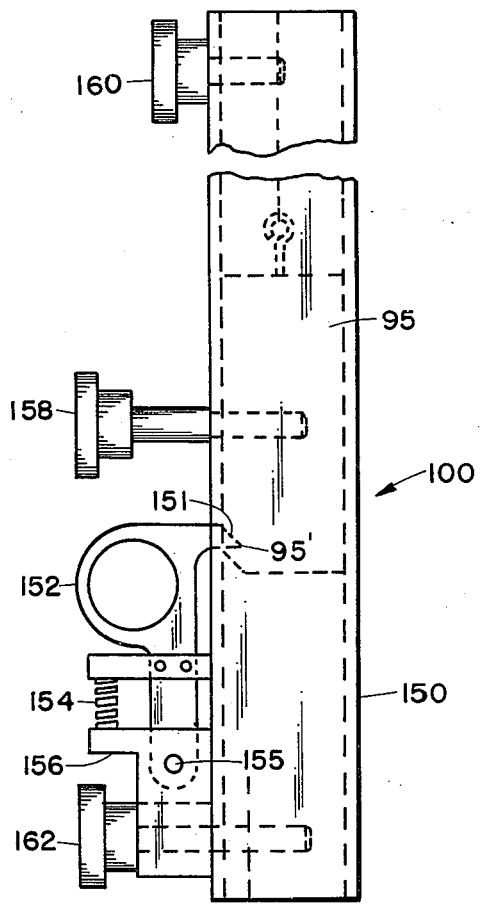
FIG. 7 is a fragmentary enlarged right side elevation of the weight release mechanism shown in FIG. 2.

The trigger release mechanism 100 for the gravity drive is shown in detail in FIGS. 2 and 7 and comprises a rectangular sleeve 150 adapted to receive weight 95 which includes a notch 95' therein. Sleeve 150 includes an elongated slot 102 permitting a tip 151 of a spring loaded trigger 152 to engage the notch in the weight as seen in FIG. 7. Trigger 152 is biased in its normally engaging position with weight 95 by means of a spring 154 coupled between a mounting block 156 and the trigger 152 pivotally mounted thereto by means of pin 155. A knob 158' has a shaft which extends into slot 102 and is coupled to weight 95 for lowering the weight and locking it in a cocked position.

The travel length of the drive weight 82 can be varied by adjusting the position of upper limit stop 160 in slot 102. A lower travel limit stop 162 is also provided and can be employed to shift the position of the trigger block 156 in slot 102 to adjust the lowermost locked position of weight 95 if desired. The locking screws 158, 160 and 162 are mounted within slot 102 with conventional mounting hardware to provide the adjustment and stop functions.

Having described the mechanism making up the coating machine and the novel coating tray therefor, a description of the use of the machine and tray to provide a uniform coat of fluid of predetermined thickness on the stencil screen is now described.

OPERATION

The operation of the machine is best understood by referring to FIGS. 1, 4, 12 and 13. Initially, it is noted that tray coating assembly 60 is removable from the machine by disengaging the pivot pin 21' from the slot 73 of arm 71. When initially setting up the machine, therefore, the tray will typically not be positioned thereon. The screen and screen frame assembly (37, 36) is positioned on the support brackets 42 and 46 in centered alignment on the base as seen in FIGS. 1 and 4.

Next, the gravity drive mechanism is positioned in a ready or cocked position by pulling counterweight 95 downwardly by knob 158' until the trigger 152 engages the weight and holds it in the ready position. This moves the carriage assemblies 20 and 52 to the left side of the machine as seen in FIGS. 1 and 4. The speed regulator adjustment knob 147 (FIG. 6) is adjusted for the desired speed corresponding to the viscosity of the coating fluid employed. Typically, where the machine is employed with a single type of photo-resist, once the speed regulator is initially set, it need not be readjusted.

The coating tray assembly 60 is then positioned on the machine by engaging pin 21' with notch 73 and resting the coating tray on the screen 37 in a centered fashion as seen in FIGS. 1 and 4. Valve 76 of the coating mechanism is positioned in a closed position opposite that shown in FIG. 4 and the fluid coating to be applied to the screen is poured into the trough of the flow coating tray. Next, the desired thickness of coating is preset by adjusting knob 26 which rotates the pivot axle 27 of carriage 20 in directions illustrated by the arrow C shown in FIG. 4.

As arm 21 is rotated by this adjustment, the blades 72 and 74 of the coating assembly 60 are tilted such that the trailing blade 74 can be adjusted to a desired height above the screen 37 while the leading edge 72 of the coating tray rests upon the screen. Thus for example, if adjustment screw 26 is turned so that arm 21 rotates in a counterclockwise direction, coating trough 62 will be tilted in a generally clockwise direction to raise the trailing edge from the screen and apply a thicker coating thereto. This is illustrated in FIGS. 12 and 13 where for a thickness $\Delta_1$, as seen in FIG. 12, adjustment knob 26 is positioned in a first position and if a greater thickness such as $\Delta_2$, shown in FIG. 13, is desired, the knob is adjusted to rotate the trough 62 by rotating arm 21 in a counterclockwise direction. The dial indicator which is coupled to the cam 32 on shaft 27 will provide a relative indication of the thickness of the coating to be applied to the screen and can be calibrated to directly read the desired coating thickness.

Having adjusted the coating thickness adjustment to the desired setting, valve 76 associated with the coating assembly 60 is switched to its open position shown in FIG. 4 and the spring trigger 152 is pulled outwardly to release the drive weight 82 which then lowers and draws carriages 20 and 52 across the screen.

Thus, the coating fluid 75 is discharged through apertures 68 and fills channel 70 and is spread uniformly across the surface of the screen by blade 74 as the coating tray is transported across the surface of the screen in the direction indicated by arrow D in FIG. 4. The support carriage 52 moves simultaneously with the coating tray and provides support for the undersurface of the screen to counteract the weight of the fluid filled coating tray. At the end of the stroke of the coating tray, valve 76 is closed and the coating tray can be removed from the machine by disengaging arm 71 from pin 21' and the coated screen removed from the support member and placed in a suitable heated environment for curing.

It is noted that the relationship of the viscosity of the fluid and the speed of movement of the coating tray across the surface of the screen is interrelated to the extent that the speed must be adjusted to be sufficiently slow to allow the fluid to fill channel 70 and thence flow onto the screen under the force of gravity and capillary attraction such that the fluid will coat to the level of the trailing blade 74 of the coating tray as it moves across the screen. For higher viscosity fluids, it may be necessary to reduce the speed of travel of the flow coater across the screen while for low viscosity fluids, the speed may be increased.

Although the preferred embodiment described employs a flow coating tray 60 of a particularly unique design, it is to be understood that various flow coating mechanism can be employed with the machine of the present invention and coupled to the carriage 20 to be transported across the surface of the screen. Likewise, the flow coating tray assembly 60 can be employed with other types of flow coating machines where the tray is transported across the surface of the screen. Its use is not limited to the machine of the preferred embodiment or machines used for coating relatively small screens. Other modifications to the present invention will become apparent to those skilled in the art but will fall within the scope of the present invention as defined by the appended claims.

The embodiments of the invention in which an exclusive property or privilege is claimed are defined as follows:

1. A coating system for applying a uniform coat of fluid to planar stock material, said system comprising:
   means for holding planar stock;
   a tray comprising a generally V-shaped trough with end walls defining a reservoir for fluid and including a plurality of apertures formed through the bottom apex of said trough and spaced along at least a portion of the length of the tray wherein said tray includes a channel formed in the apex of said trough on the exterior thereof and in communication with said apertures, said channel being defined by a continuous spreading blade extending adjacent said apertures and a second blade wherein said blades span said apertures and extend the length of said channel and wherein said apertures are separated by lands having side walls tapered inwardly toward adjacent apertures in a direction toward said channel to facilitate the uniform filling of said channel with fluid from said trough;
   means for mounting said tray with respect to planar stock held by said holding means such that said blade is spaced a predetermined distance from the surface of such stock; and
   means providing relative motion between said tray and the stock while maintaining the distance between said blade and the stock relatively constant to apply a uniform thickness coat of fluid to the stock wherein said mounting means causes said tray to be pivotally coupled to said providing means such that said second blade of said tray rests upon the surface of the planar stock and said spreading blade is adjustably spaced from the surface of the stock.

2. Means for applying a uniform coating of predetermined thickness to a surface comprising:
   an elongagted generally V-shaped trough for dispensing a fluid contained therein, through a plurality of apertures formed through the bottom of said trough and spaced along its length, said trough including at least one continuous blade extending outwardly from and along the length of the exterior of said trough adjacent said apertures wherein said trough includes a channel formed at the apex of said trough on the exterior side thereof, said channel extending along the trough in communication with said apertures and defining said one blade and a second blade wherein said blades extend along the length of said trough and span said apertures and wherein said apertures are separated by lands having side walls tapered inwardly toward adjacent apertures in a direction toward said channel to facilitate the uniform filling of said channel with fluid from said trough;
   means for pivotally mounting said trough above a surface to be coated;
   means for adjusting the pivot angle of said trough to vary the distance of an edge of said blade from a surface to be coated; and
   means for moving the trough across the surface to be coated.

3. A coating system for applying a uniform coat of viscous fluid to relatively thin and flexible planar stock material, said system comprising:
  frame means for supporting planar stock to be coated;
  a tray defining a generally V-shaped trough having a primary reservoir for fluid and including a plurality of apertures formed through the apex of said trough and spaced along at least a portion of the length thereof, valve means operatively associated with said trough for selectively cutting off flow through said apertures, said tray including a relatively narrow channel formed in the exterior thereof and in communication with said apertures, said channel being defined by a continuous spreading blade extending along one edge and a second blade extending along an opposite edge wherein said blades span said apertures and extend the length of said channel, said apertures and said channel shaped such that said viscous fluid to be applied by gravity flow uniformly fills said channel between said blades and defines a secondary fluid reservoir in direct communication with said planar stock to facilitate the uniform coating of said stock;
  means for mounting said tray with respect to planar stock held by said frame means such that said spreading blade is spaced a predetermined distance from the surface of such stock, said mounting means causing said tray to be pivotally coupled to said providing means such that said second blade of said tray rests upon the surface of the planar stock and said spreading blade is adjustably spaced from the surface of the stock; and
  means providing relative motion between said tray and the stock at a rate such that fluid from said channel is applied to said stock to apply a uniform thickness coat of fluid to the stock and said channel is continuously filled by fluid from said primary reservoir.

4. Means for applying a uniform coating of a viscous fluid of predetermined thickness to a printing screen comprising:
  an elongated generally V-shaped trough including a relatively narrow channel formed at the exterior apex of said trough defining a pair of spaced continuous blades, aperture means formed through the bottom of said trough along its length and communicating with said trough and said channel and shaped to assure a continuous supply of coating fluid is dispensed to uniformly fill said channel from said trough;
  means for pivotally mounting said trough above a surface of a printing screen to be coated;
  means for adjusting the pivot angle of said trough to vary the distance of an edge of said blade from said surface to be coated; and
  means for moving the trough across the surface of a printing screen to be coated at a speed such that fluid from said channel is applied to uniformly coat said screen and said channel is continuously refilled by fluid from said trough.

5. The apparatus as defined in claim 4 wherein said aperture means comprises a plurality of apertures spaced along said trough and wherein said apertures are tapered outwardly from said trough toward said channel to facilitate the uniform filling of said channel by fluid from said trough.

6. A coating tray providing a primary reservoir for a supply of viscous coating fluid, and a secondary reservoir for directly applying the viscous fluid to a stencil screen when said tray is positioned over a stencil screen fitted in a screen frame and is moved across said screen to apply a uniform fluid coating thereto by gravity flow, said tray comprising:
  a trough defined by upwardly and outwardly extending first and second side walls coupled to each other at an apex of said trough, said trough including end walls coupled to said side walls at opposite ends thereof to define a primary fluid reservoir, said trough further including a plurality of apertures formed through said apex to provide a fluid flow path from said primary reservoir to a secondary reservoir defined by a relatively narrow channel formed inwardly along the junction of said side walls at the exterior thereof, wherein said channel communicates with said apertures and the sides of said channel define a continuous spreading blade and a second blade, which blades extend along said trough on opposite sides of said apertures, said channel and said apertures shaped to provide uniform and continuous filling of said channel with viscous fluid from said trough as said coating tray is moved across the surface of a screen with said second blade in contact with the screen and said spreading blade spaced from the screen a predetermined distance such that a continuous supply of coating fluid is provided by said channel in direct communication with the screen;
  valve means operatively associated with said trough for selectively blocking said apertures to cut off the flow of fluid therethrough; and
  means for positioning said tray with respect to said screen such that said spreading blade is spaced a predetermined adjustable distance from the surface of the screen and wherein said positioning means positions said tray in pivotal relationship on the screen with said second blade in contact with the screen and said spreading blade spaced from the surface of the screen a distance depending upon the selected pivot angle.

7. The apparatus as defined in claim 6 wherein said apertures are tapered outwardly from said trough toward said channel to facilitate the uniform filling of said channel by fluid from said trough.

* * * * *